(12) United States Patent
Marquart et al.

(10) Patent No.: US 11,632,103 B2
(45) Date of Patent: Apr. 18, 2023

(54) HIGH-SPEED VOLTAGE CLAMP FOR UNTERMINATED TRANSMISSION LINES

(71) Applicant: International Business Machines Corporation, Armonk, NY (US)

(72) Inventors: Chad Andrew Marquart, Austin, TX (US); Glen A. Wiedemeier, Austin, TX (US); Daniel M. Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/479,058

(22) Filed: Sep. 20, 2021

(65) Prior Publication Data

US 2023/0088871 A1    Mar. 23, 2023

(51) Int. Cl.
| | |
|---|---|
| H03K 19/00 | (2006.01) |
| H03K 5/08 | (2006.01) |
| H04L 25/02 | (2006.01) |
| H03K 19/003 | (2006.01) |
| H03K 19/0944 | (2006.01) |
| H03K 17/687 | (2006.01) |

(52) U.S. Cl.
CPC ............. H03K 5/08 (2013.01); H03K 17/687 (2013.01); H03K 19/00315 (2013.01); H03K 19/0944 (2013.01); H04L 25/0264 (2013.01)

(58) Field of Classification Search
CPC .. H03K 5/08; H03K 17/687; H03K 19/00315; H03K 19/0944
See application file for complete search history.

(56) References Cited

U.S. PATENT DOCUMENTS

| | | | | |
|---|---|---|---|---|
| 5,731,999 | A | | 3/1998 | Takahashi |
| 5,877,647 | A | * | 3/1999 | Vajapey ................... H03F 1/523 327/170 |
| 6,097,237 | A | * | 8/2000 | Singh ................ H03K 19/00315 326/27 |
| 6,137,322 | A | * | 10/2000 | Ten Eyck ............. H03K 17/167 327/112 |

(Continued)

FOREIGN PATENT DOCUMENTS

WO      2011135094 A1    11/2011

OTHER PUBLICATIONS

Wu et al., "An active clamp circuit for voltage regulation module (VRM) applications" IEEE Transactions on Power Electronics 16.5 (Sep. 2001) pp. 623-634.

*Primary Examiner* — Tuan T Lam
(74) *Attorney, Agent, or Firm* — Cantor Colburn LLP; Jeffrey Ingalls

(57) ABSTRACT

A high-speed voltage clamping circuit includes p-type field effect transistor (PFET) biasing circuit, an n-type field effect transistor (NFET) biasing circuit, and a field effect transistor (FET) clamp circuit. The PFET biasing circuit is configured to generate a PFET biasing voltage. The NFET biasing circuit is configured to generate a NFET biasing voltage. The FET clamp circuit is in signal communication with the PFET biasing circuit and the NFET biasing circuit. The PFET biasing circuit controls operation of the clamping circuit in response to a voltage overshoot event and the NFET biasing circuit controls operation of the clamping circuit in response to a voltage undershoot event.

10 Claims, 5 Drawing Sheets

(56) References Cited

U.S. PATENT DOCUMENTS

| | | | | |
|---|---|---|---|---|
| 6,184,730 B1* | 2/2001 | Kwong | ............... | H03K 17/167 |
| | | | | 327/112 |
| 6,388,495 B1* | 5/2002 | Roy | ................... | G06F 13/4086 |
| | | | | 327/309 |
| 7,126,389 B1* | 10/2006 | McRae | ............... | H03K 17/167 |
| | | | | 326/85 |
| 8,373,484 B2 | 2/2013 | Kudo et al. | | |
| 9,000,791 B2 | 4/2015 | Driesen et al. | | |
| 9,071,048 B2 | 6/2015 | Divan | | |
| 9,742,399 B2* | 8/2017 | Shen | .................. | H03K 17/6872 |
| 2004/0246021 A1 | 12/2004 | Dreps et al. | | |
| 2009/0067614 A1 | 3/2009 | Washburn et al. | | |
| 2015/0092308 A1* | 4/2015 | P | .................... | H03K 19/018592 |
| | | | | 361/86 |

* cited by examiner

HIGH-SPEED VOLTAGE CLAMP FOR UNTERMINATED TRANSMISSION LINES

BACKGROUND

The present invention generally relates to integrated circuit development, and more specifically, to a high-speed voltage clamp for unterminated transmission lines included in a wide low latency input/output (I/O) bus of an integrated circuit.

Advancements in integrated circuit (IC) packaging technology have significantly increased signal routing density in the IC. The increased signal routing density has not only resulted in an increased amount of signal wires that are routed through the package, but has also allowed for utilizing shorter wires. The shorter-length wires provide less metal from which to dissipate power, thereby reducing overall insertion losses and inductance so that impedance-matched termination at the sink is no longer a requirement to limit ringing. These advancements have facilitated the ability to fabricate power efficient, wide low-latency busses for high-speed input/output (I/O) applications.

SUMMARY

Embodiments of the present invention are directed to a high-speed voltage clamping circuit. According to a non-limiting embodiment, a high-speed voltage clamping circuit includes p-type field effect transistor (PFET) biasing circuit, an n-type field effect transistor (NFET) biasing circuit, and a field effect transistor (FET) clamp circuit. The PFET biasing circuit is configured to generate a PFET biasing voltage. The NFET biasing circuit is configured to generate a NFET biasing voltage. The FET clamp circuit is in signal communication with the PFET biasing circuit and the NFET biasing circuit. The PFET biasing circuit controls operation of the clamping circuit in response to a voltage overshoot event and the NFET biasing circuit controls operation of the clamping circuit in response to a voltage undershoot event.

Other embodiments of the present invention implement a method of protecting unterminated high-speed data signals from voltage overshoots and voltage undershoots. The method comprises generating from a p-type field effect transistor (PFET) biasing circuit a PFET biasing voltage, and generating from an n-type field effect transistor (NFET) biasing circuit an NFET biasing voltage. The method further comprises controlling operation of a clamping circuit using the PFET biasing voltage in response to a voltage overshoot event and controlling operation of the clamping circuit using the NFET biasing voltage in response to a voltage undershoot event.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
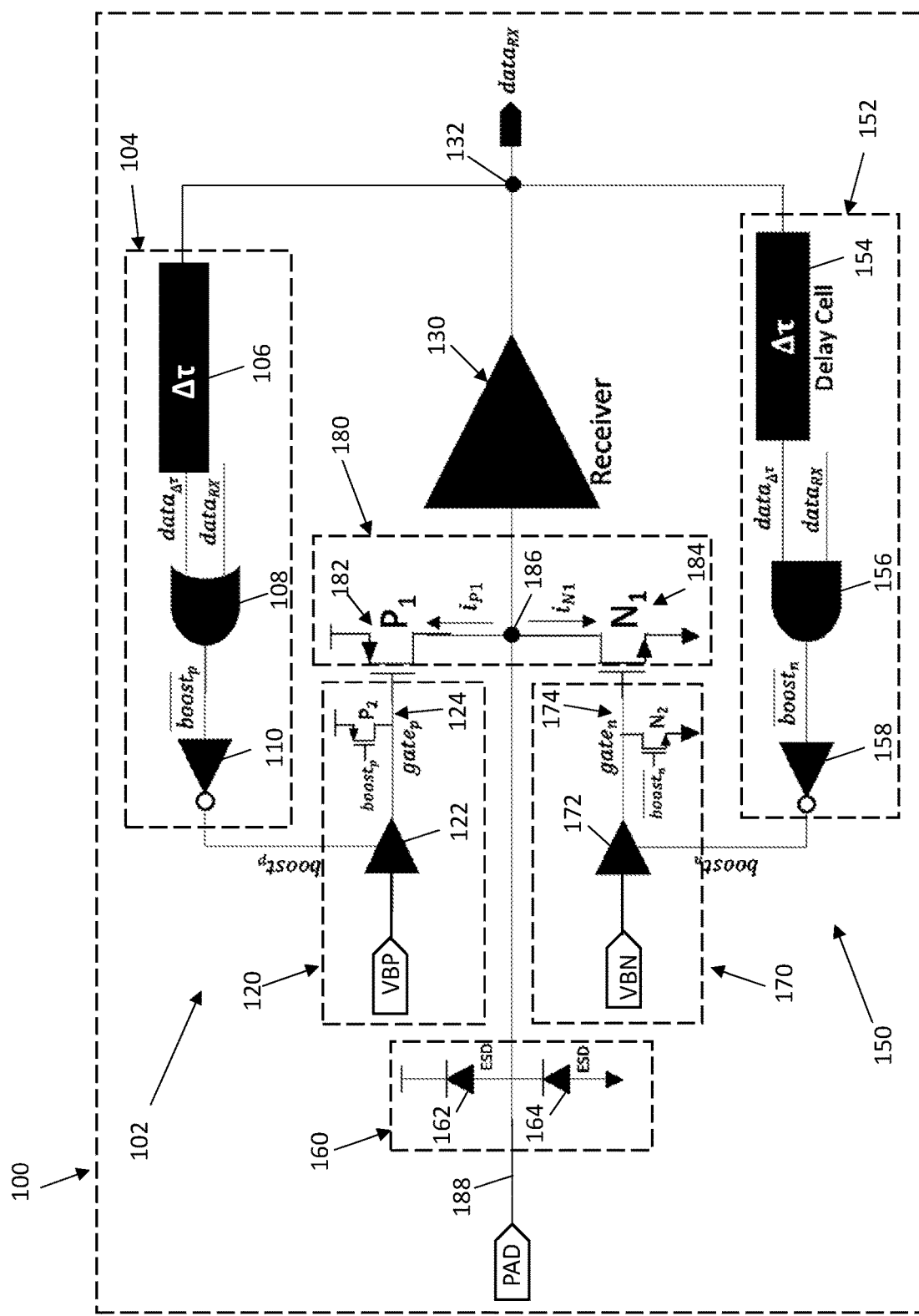
FIG. 1 is a diagram illustrating a high-speed voltage clamping circuit according to a non-limiting embodiment of the present disclosure.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

At very high speeds, circuit board traces and transmission busses can behave like transmission lines. Unless the impedance of the transmission line matches that of the load it drives, the signal will degrade due to signal reflections caused by impedance mismatching. Signal reflections produce or contribute to a number of problems, including false triggering in clock lines, erroneous bits on data, address, and control lines, clock and signal jitter, and an increase in total emissions from the pc board. One solution to reduce these transmission-line effects is to employ diode terminations, which provide terminating impedances that protect against overshoot, undershoot, and jitter. However, the implementation of diode terminations increases the number of components in the circuit, thereby reducing available packaging area. In addition, diode terminations require a relatively high voltage to switch on thereby increasing the response time at which they can protect against an overshoot or undershoot. As a result, diode terminations may not effectively protect against overshoots and undershoots in high-speed data applications.

Another attempt to reduce transmission-line effects is to terminate the transition lines using, for example, parallel, series, Thevenin, alternating current (AC) or diode-based termination techniques. In conventional termination schemes, the transmission line is typically terminated external to the integrated circuit, i.e., the termination resistors/capacitors are electrically connected to the input/output pads of the integrated circuit on the printed circuit board. However, external termination can be problematic because it may not be possible to position the actual termination resistors/capacitors within close proximity to the signal's final destination (e.g., the receiver). In addition, the redistribution metal required for interconnection between the receiver inside the integrated circuit and the transmission line on the printed circuit board has its own parasitic characteristics that can alter the true termination requirements for the line and contribute to reflection noise. Area and power consumption are also a concern with employing very wide input/output (I/O) busses due to the large number of external terminations.

Various non-limiting embodiments of the present disclosure address the short-comings of the prior art by providing a high-speed voltage clamp circuit for un-terminated transmission lines. The high-speed voltage clamp circuit is capable of providing both overshoot protection and undershoot protection for high-speed signals delivered on a transmission line that is un-terminated at the sink. In one or more non-limiting embodiments, the high-speed voltage clamp circuit utilizes timed feedback circuits, which eliminate the need to employ in-line diodes and avoids the risk for contention when implementing voltage clamps having low trigger voltages.

With reference now to FIG. 1, a high-speed voltage clamping circuit 100 is illustrated according to one or more embodiments of the present invention. The high-speed voltage clamping circuit 100 includes a PFET branch 102, an NFET branch 150, and a FET clamp circuit 180 in signal communication with the PFET branch 102 and the NFET branch 170. According to one or more embodiments of the present invention, the PFET branch 102 controls the FET clamp circuit 180 to protect against voltage overshoot events while the NFET branch 170 controls the FET clamp circuit 180 to protect against voltage undershoot events.

The PFET branch 102 includes a PFET timing circuit 104 and a PFET biasing circuit 120. The PFET timing circuit 104 includes a PFET delay circuit 106, an OR-gate 108, and a PFET inverter 110. The PFET delay circuit 106 includes an input configured to receive the data signal (data$_{RX}$) and an output connected to the OR-gate 108 to deliver a delayed data signal (data$_{A\tau}$). The OR-gate 108 includes a first input configured to receive the data signal (data$_{RX}$), a second input configured to receive the delayed data signal (data$_{A\tau}$), and an output configured to output a logic output value being one of a logic "1" signal or a logic "0" signal based on the values of the data signal (data$_{RX}$) and the delayed data signal (data$_{A\tau}$). The PFET inverter 110 includes an input configured to receive the logic output value from the OR-gate 108, and an output configured to invert the logic output value to generate a PFET selector signal (boostp).

The PFET biasing circuit 120 includes a PFET tri-state buffer 122, and a pull-up PFET 124. The PFET tri-state buffer 122 includes a first input configured to receive an analog PFET biasing voltage (VBP), a second input configured to receive the selector signal (boostp) output from the PFET inverter 110, and an output configured to output the analog PFET biasing voltage (VBP). According to a non-limiting embodiment, the analog PFET biasing voltage (VBP) is set to a voltage that is greater than the positive rail supply voltage (VDD). The pull-up PFET 124 includes a source terminal configured to receive a first source voltage supply, a gate terminal configured to receive the data signal (data$_{RX}$), and a drain terminal connected to the output of the PFET tri-state buffer 122. In one or more non-limiting embodiments, the first source voltage supply is the positive rail supply voltage (VDD).

The NFET branch 150 includes an NFET timing circuit 152 and an NFET biasing circuit 170. The NFET timing circuit 152 includes an NFET delay circuit 154, an AND-gate 156, and an NFET inverter 158. The NFET delay circuit 154 including an input configured to receive the data signal (data$_{RX}$) and an output connected to the AND-gate 156 to deliver a delayed data signal (data$_{A\tau}$). Although the high-speed voltage clamping circuit 100 is described as employing two individual timing circuits (i.e., the PFET timing circuit 106 and the NFET timing circuit 152), it should be appreciated that a single timing circuit can be utilized to generate a common delayed data signal (data$_{A\tau}$) that is delivered to both the OR-gate 108 and the AND-gate 156.

The AND-gate 156 includes a first input configured to receive the data signal (data$_{RX}$), a second input configured to receive the delayed data signal (data$_{A\tau}$), and an output configured to output a logic output value being one of a logic "1" signal or a logic "0" signal based on the values of the data signal (data$_{RX}$) and the delayed data signal (data$_{A\tau}$). The NFET inverter 158 includes an input configured to receive the logic output value from the AND-gate 156, and an output configured to invert the logic output value to generate an NFET selector signal (boostn).

The NFET biasing circuit 170 includes an NFET tri-state buffer 172, and a pull-down NFET 174. The NFET tri-state buffer 172 includes a first input configured to receive an analog NFET biasing voltage (VBN), a second input configured to receive the NFET selector signal (boostn) output from the NFET inverter 158, and an output configured to output the analog NFET biasing voltage (VBN). According to a non-limiting embodiment, the analog NFET biasing voltage (VBN) is set to a voltage that is less than the negative rail supply voltage (VSS). The pull-down NFET 174 includes a second source terminal, a gate terminal configured to receive the data signal (data$_{RX}$), and a drain terminal connected to the output of the NFET tri-state buffer 172. In one or more non-limiting embodiments, the second source terminal is connected to a ground potential or the negative rail voltage supply (VSS).

The FET clamp circuit 180 includes a clamping PFET 182 and a clamping NFET 184. According to a non-limiting embodiment, the clamping PFET 182 provides protection against voltage overshoot events that may occur when the input voltage (PAD) is delivered to the receiver 130 and the clamping NFET 184 provides protection against voltage undershoot events that may occur when an input voltage (PAD) is delivered to the receiver 130. In one or more embodiments, the input voltage (PAD) is provided by a transmitter having an output connected to transmission line 188.

The clamping PFET 182 includes a first biasing gate terminal connected to a drain of the pull-up PFET 124, while the clamping NFET 184 includes a second biasing gate terminal connected to a drain of the pull-down NFET 174. The clamping PFET 182 further including a first drain terminal while the clamping NFET 184 further includes a second drain terminal. The first drain terminal of the clamping PFET 182 is connected to the second drain terminal of the clamping NFET 184 to define a common drain node 186 that is configured to receive the input voltage (PAD) via transmission line 188.

According to a non-limiting embodiment, a load 130 is connected to the common drain node 186. The load includes, for example, a receiver 130 that has an input connected to the common drain node 186 to receive an input signal (e.g., PAD) via the transmission line 188 and an output 132 configured to output a data signal (data$_{RX}$). In one or more non-limiting embodiments, the high-speed voltage clamping circuit 100 can include an electrostatic discharge (ESD) circuit 160 connected to the transmission line 188. The ESD circuit 188 can include a first diode 162 having an anode connected to the transmission line 188, and a second diode 164 having a cathode connected to the transmission line 188 and the anode of the first cathode 162. The ESD circuit 188 is configured to protect against sudden voltage spikes that may occur while transmitting the input signal (e.g., PAD) on the transmission line 188.

With continued reference to FIG. 1, an input voltage (PAD) applied to the transmission line 118 appears at the common drain node 186 and is input to the receiver 130. Based on the input voltage (PAD), the receiver generates the data signal (data$_{RX}$) at the receiver output 132. The PFET timing circuit 104 and the NFET timing circuit 152 each utilize the data signal (data$_{RX}$) to establish time delay for activating the PFET biasing circuit 120 and the NFET biasing circuit 170, respectively. More specifically, an input of the PFET delay circuit 106 is connected to the receiver output 132 to receive the data signal (data$_{RX}$) and generate a delayed data signal (data$_{A\tau}$), which is delivered to the OR-gate 108. Likewise, the input of the NFET delay circuit 154 is connected to the receiver output 132 to receive the data signal (data$_{RX}$) and generate a delayed data signal (data$_{A\tau}$), which is delivered to the AND-gate 156.

According to one or more embodiments of the present invention, both the PFET delay circuit 106 and the NFET delay circuit 154 can be constructed using a plurality of inverters connected in serial with one another. The plurality of inverters includes any even-numbered amount of inverters. Increasing the number of inverters increases the delay time at which the data signal (data$_{RX}$) is delivered to the OR-gate 108 and the AND-gate 156, respectively. According to a non-limiting embodiment, the delay time set by the PFET delay circuit 106 and the NFET delay circuit 154, respectively, is set to be less than the cycle time during which data can be transmitted from the transmission line 188 and output by the receiver 130.

The PFET biasing circuit 120 and the NFET biasing circuit 170 each set a biasing voltage for the FET clamp circuit 180. Turning to the PFET biasing circuit 120, the PFET tri-state buffer 122 receives the analog PFET biasing voltage (VBP), which is selectively delivered to the pull-up PFET 124 based on the output of the PFET timing circuit 104. For example, once the OR-gate 108 receives the delayed data signal (data$_{A\tau}$), the PFET inverter 110 outputs a tristate selector signal (boostp) causing the PFET tristate buffer 122 to deliver the analog PFET biasing voltage (VBP) to the pull-up PFET 124. In turn, the pull-up PFET 124 is pulled to the analog PFET biasing voltage (VBP) and lowers the trigger voltage at which the pull-up PFET 124 will react to overshoot events to conduct current flow (iP1).

Similarly, the NFET tri-state buffer 172 receives the analog NFET biasing voltage (VBN), which is selectively delivered to the pull-down NFET 174 based on the output of the NFET timing circuit 152. For example, once the AND-gate 156 receives the delayed data signal (data$_{A\tau}$), the NFET inverter 158 outputs a tristate selector signal (boostn) causing the NFET tristate buffer 172 to deliver the analog NFET biasing voltage (VBN) to the pull-down NFET 172. In turn, the pull-down NFET 172 is pulled to the analog NFET biasing voltage (VBN) and lowers the trigger voltage at which the pull-down NFET 174 will react to undershoot events to conduct current flow (iN1).

The PFET timing circuit 104 and the NFET timing circuit 152 each operate to control the PFET biasing circuit 120 and the NFET biasing circuit 170, and ensure that the pull-up PFET 124 and the pull-down NFET 172 do not work against the input signal (PAD) transmitting on the transmission line 188. The time delays set by the PFET timing circuit 104 and the NFET timing circuit 152 limit the window of time during which the pull-up PFET 124 and the pull-down NFET 172 are switched on to apply the biasing voltages (VBP and VBN) to the clamping PFET 182 and the clamping NFET 184. Accordingly, the operating frequency of the IC is utilized as a design parameter so that the PFET and NFET timing circuits 104 and 152 can be configured to be less than the cycle time or unit interval at which the next bit of data can be sent from a transmitter connected to the transmission 180 and output by the receiver 130.

Figure 2:
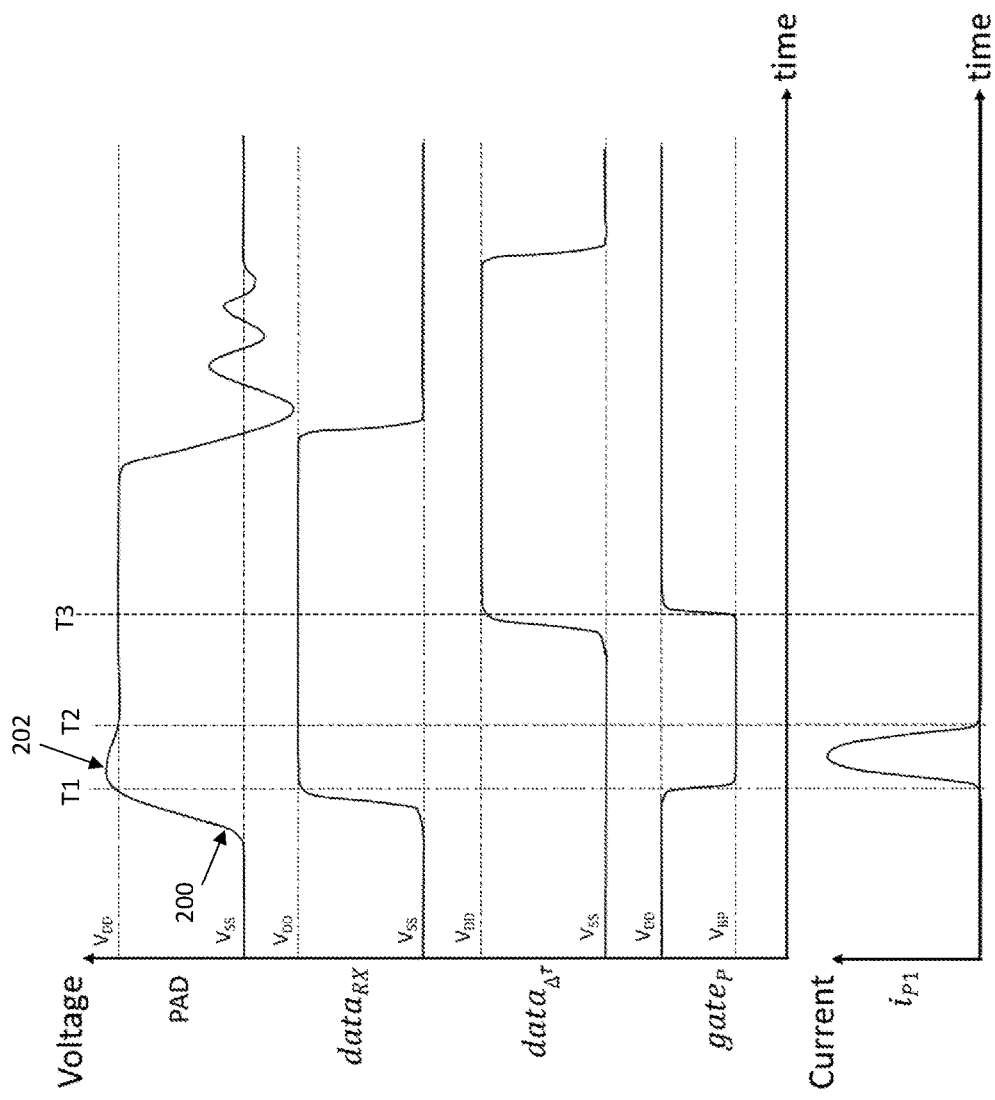
FIG. 2 depicts signal diagrams of the high-speed voltage clamping circuit shown in FIG. 1 operating during an overshoot event according to a non-limiting embodiment of the present disclosure.

Turning to FIG. 2, signal diagrams corresponding to the operation of the high-speed voltage clamping circuit 100 shown in FIG. 1 during a voltage overshoot event are illustrated according to a non-limiting embodiment. The high-speed voltage clamping circuit 100 detects a rising transition 200 (e.g., a when the signal transitions from low (logic "0") to high (logic "1")) occurring in the input voltage (PAD). Accordingly, the receiver 130 generates a data signal (data$_{RX}$) having a high value (e.g., logic "1"), which is output to the OR-gate 108 and the PFET delay circuit 106.

At time T1, an overshoot event 200 occurs during which the input voltage (PAD) rises above (i.e., overshoots) the positive supply rail (VDD), while the data signal (data$_{RX}$) has a high value (e.g., logic "1") and the delayed data signal (data$_{A\tau}$) has a low value (e.g., logic "0"). Accordingly, the PFET delay circuit 106 generates the selector signal (boostp), which pulls the pull-up PFET 124 (gate$_P$) to the PFET biasing voltage (VBP). Accordingly, the clamping PFET 182 is biased to a voltage that is lower than the positive rail supply voltage (VDD), thereby forcing the clamping PFET 182 to be much more sensitive to voltage overshoots present in the input voltage (PAD). Thus, a slight level of the input voltage (PAD) that increases above the positive rail supply voltage (VDD) causes the overshoot event 202 and causes the clamping PFET 182 to conduct current (iP1). The amount of current that flows through the clamping PFET 182 is proportional to the amount of the input voltage (PAD) that overshoots the positive supply rail (VDD).

At time T2, the input voltage (PAD) is pulled to the positive supply rail (VDD) and the current (iP1) flowing through the clamping PFET 182 is effectively zero. Once the delayed high data signal (data$_{A\tau}$) is output to the OR-gate 108 at time T3, the PFET delay circuit 106 halts the selector signal (boostp), which raises the trigger voltage at which pull-up PFET 124 will react. Accordingly, when the clamping PFET 182 is biased by VDD it requires a much larger overshoot event to conduct current flow.

Figure 3:
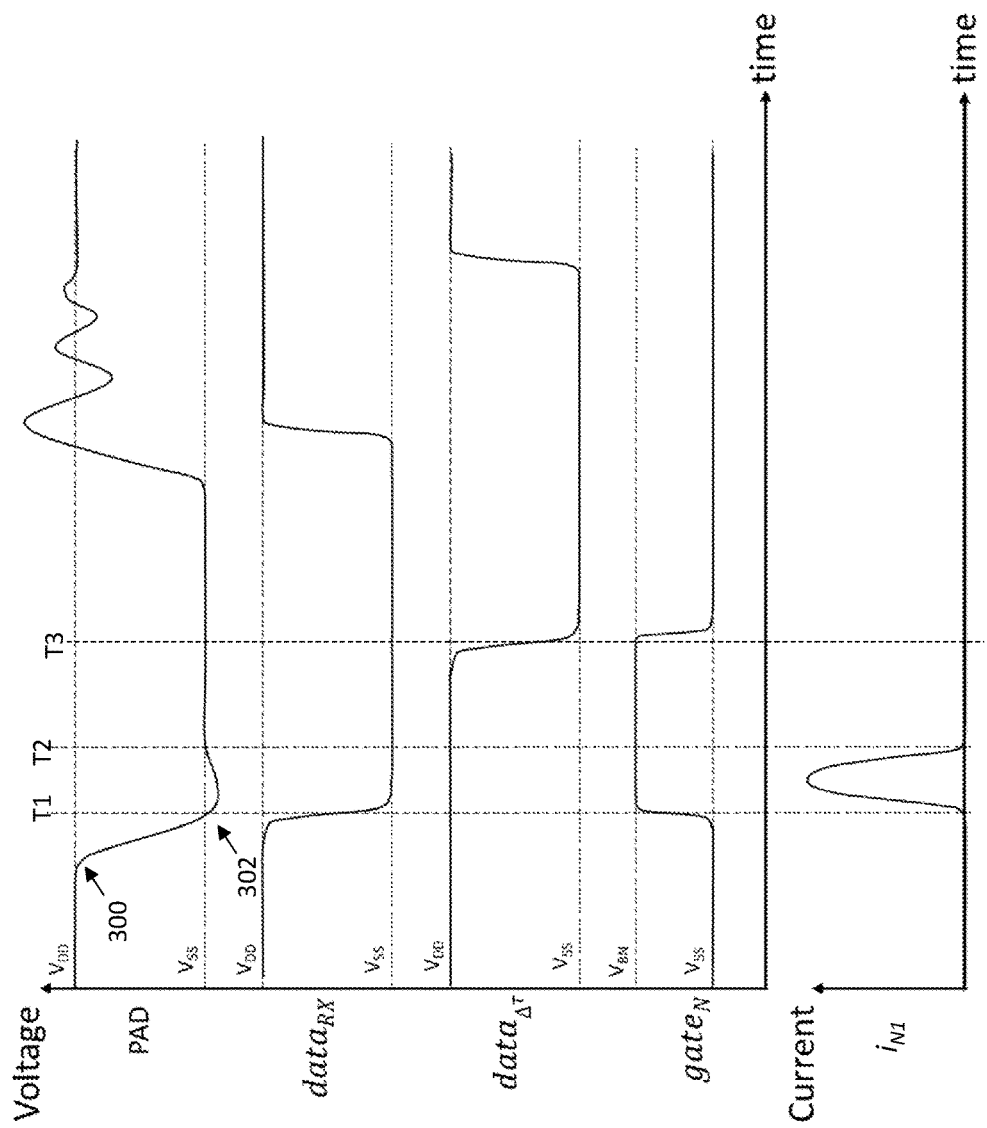
FIG. 3 depicts signal diagrams of the high-speed voltage clamping circuit shown in FIG. 1 operating during an undershoot event according to a non-limiting embodiment of the present disclosure.

Referring to FIG. 3, signal diagrams corresponding to the operation of the high-speed voltage clamping circuit 100 during a voltage undershoot event are illustrated according to a non-limiting embodiment. The high-speed voltage clamping circuit 100 detects a falling transition 300 (e.g., a when the signal transitions from high (logic "1") to low (logic "0")) occurring in the input voltage (PAD). Accordingly, the receiver 130 generates a data signal (data$_{RX}$) having a low value (e.g., logic "0"), which is output to the AND-gate 156 and the NFET delay circuit 154.

At time T1, an undershoot event 302 occurs during which the input voltage (PAD) falls below (i.e., undershoots) the negative supply rail (VSS), while the data signal (data$_{RX}$) has a low value (e.g., logic "0") and the delayed data signal (data$_{A\tau}$) has a high value (e.g., logic "1"). Accordingly, the NFET delay circuit 154 generates the selector signal (boostn), which pulls the pull-down NFET 124 (gate$_N$) to the NFET biasing voltage (VBN). Accordingly, the clamping NFET 184 is biased to a voltage that is higher than the negative rail supply voltage (VSS), thereby forcing the clamping NFET 184 to be much more sensitive to voltage undershoots present in the input voltage (PAD). Thus, a slight level of the input voltage (PAD) that falls below the negative rail supply voltage (VSS) causes the undershoot event 302 and cause the clamping NFET 184 to conduct current (iN1). The amount of current that flows through the clamping NFET 184 is proportional to the amount of the input voltage (PAD) that undershoots the negative supply rail (VSS).

At time T2, the input voltage (PAD) is pulled to the negative supply rail (VSS) and the current (iN1) flowing through the clamping NFET 184 is effectively zero. Once the delayed low data signal (data$_{Ar}$) is output to the AND-gate 156 at time T3, the NFET delay circuit 154 halts the selector signal (boostn), which lowers the trigger voltage at which the pull-down NFET 174 will react. Accordingly, when the clamping NFET 184 is biased by VSS it requires a much larger undershoot event to conduct current flow (iN1).

Figure 4:
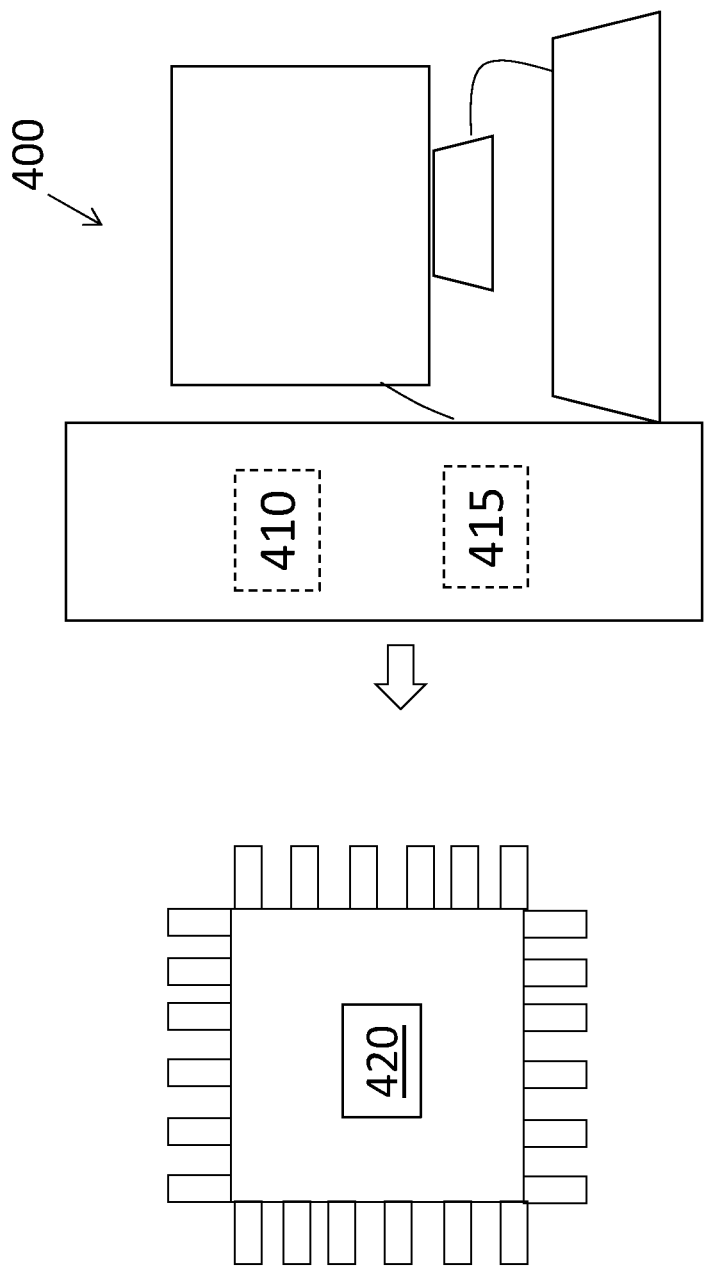
FIG. 4 depicts a block diagram of a system to provide a high-speed voltage clamp circuit for un-terminated transmission lines in integrated circuit design according to one or more non-limiting embodiments of the present disclosure.

With reference now to FIG. 4, a block diagram depicts a system 400 to provide a high-speed voltage clamp circuit for un-terminated transmission lines in integrated circuit design according to one or more non-limiting embodiments of the present disclosure. The system 400 includes processing circuitry 410 and memory 415 storing one or more software programs and code (collectively referred to as software). The software can include, but is not limited to, computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server.

The processing circuitry 410 and software can be used to generate a design that is ultimately fabricated into an integrated circuit 420. The steps involved in the fabrication of the integrated circuit 420 are well-known and only briefly described herein and with reference to FIG. 4. The physical layout is finalized, in part, based on the high-speed voltage clamp circuit for un-terminated transmission lines in integrated circuit according to embodiments of the invention. The finalized physical layout is provided to a foundry. Masks are generated for each layer of the integrated circuit 420 based on the finalized physical layout. Then, the wafer is processed in the sequence of the mask order. The processing includes photolithography and etch. The fabrication is further discussed below.

Figure 5:
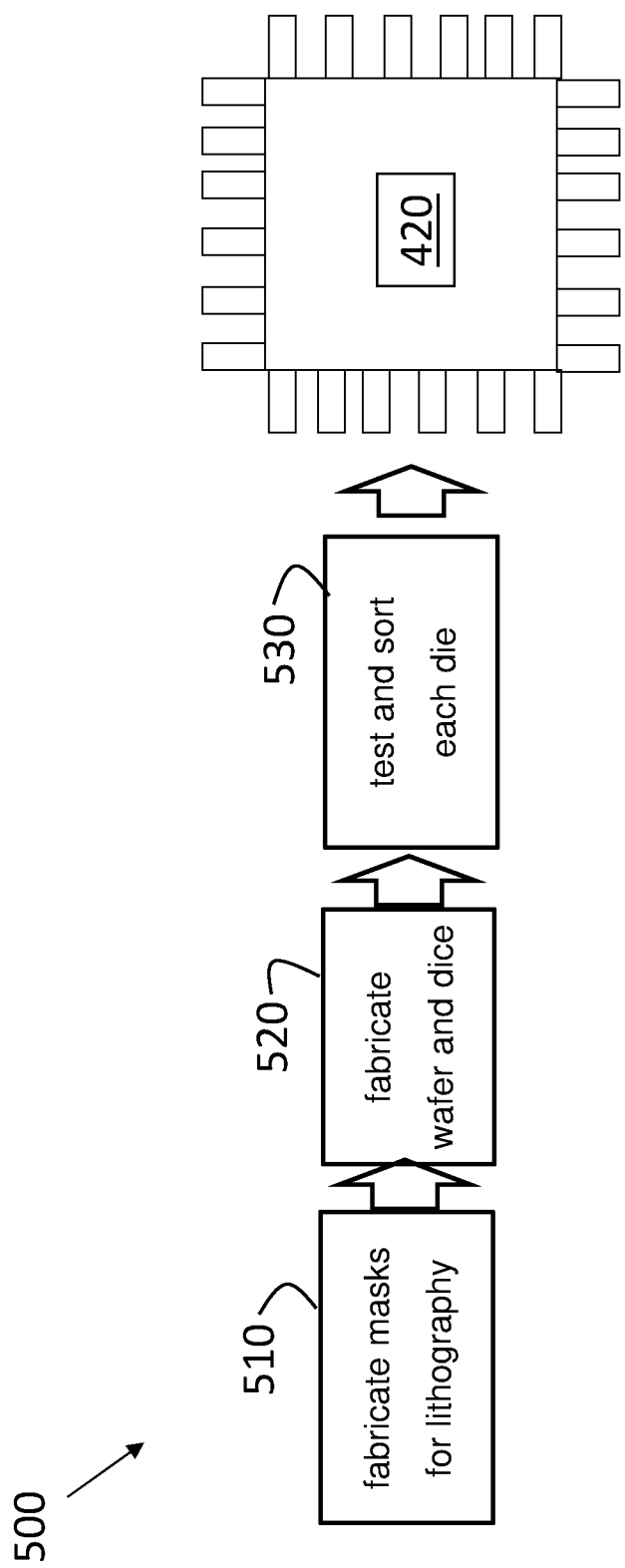
FIG. 5 is a process flow of a method of fabricating the integrated circuit according to exemplary embodiments of the invention.

FIG. 5 depicts a process flow 500 of a method of fabricating the integrated circuit according to exemplary embodiments of the invention. Once the physical design data is obtained, based, in part, on the high-speed voltage clamp circuit for un-terminated transmission lines, the integrated circuit 420 can be fabricated according to known processes that are generally described with reference to FIG. 5. Generally, a wafer with multiple copies of the final design is fabricated and cut (i.e., diced) such that each die is one copy of the integrated circuit 420. At block 510, the processes include fabricating masks for lithography based on the finalized physical layout. At block 520, fabricating the wafer includes using the masks to perform photolithography and etching. Once the wafer is diced, testing and sorting each die is performed, at block 530, to filter out any faulty die.

As described herein, various non-limiting embodiments of the present disclosure provide a high-speed voltage clamp circuit for un-terminated transmission lines. The high-speed voltage clamp circuit is capable of providing both overshoot protection and undershoot protection for high-speed signals delivered on a transmission line that is un-terminated at the sink without the need to employ in-line diodes.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A high-speed voltage clamping circuit comprising:
    a p-type field effect transistor (PFET) biasing circuit configured to generate a PFET biasing voltage;
    an n-type field effect transistor (NFET) biasing circuit configured to generate a NFET biasing voltage;
    a field effect transistor (FET) clamp circuit in signal communication with the PFET biasing circuit and the NFET biasing circuit;
    a PFET timing circuit in signal communication with the PFET biasing circuit; and
    a NFET timing circuit in signal communication with the NFET biasing circuit,
    wherein the PFET timing circuit controls a first time duration during which the PFET biasing circuit outputs the PFET biasing voltage to the clamping circuit, and wherein the NFET timing circuit controls a second time duration during which the NFET biasing circuit outputs the NFET biasing voltage to the clamp circuit, and
    wherein the PFET biasing circuit controls operation of the clamping circuit in response to a voltage overshoot event and the NFET biasing circuit controls operation of the clamping circuit in response to a voltage undershoot event,
    wherein the PFET timing circuit controls the first time duration in response to a data signal transitioning from a logic 0 value to a logic 1 value and to a delayed data signal transitioning from a logic value 0 to a logic value 1, and
    wherein the NFET timing circuit controls the second time duration in response to the data signal transitioning from a logic 1 value to a logic 0 value and the delayed data signal transitioning from a logic value 1 to a logic value 0.

2. The high-speed voltage clamping circuit of claim 1, wherein the FET clamp circuit includes a clamping PFET configured to protect against voltage overshoot events occurring in response to transmitting an input data signal to a load, and a clamping NFET configured to protect against voltage undershoot events occurring in response to transmitting the input data signal to the load.

3. The high-speed voltage clamping circuit of claim 1, wherein the PFET timing circuit comprises:
    an OR-gate including a first input configured to receive the data signal, a second input configured to receive the delayed data signal, and an output configured to output a first logic output value being one of a logic "1" signal or a logic "0" signal based on the values of the data signal and the delayed data signal; and
    a PFET inverter including an input configured to receive the first logic output value from the OR-gate and invert the first logic output value to generate a PFET selector signal; and
    wherein the NFET timing circuit comprises:
    an AND-gate including a first input configured to receive the data signal, a second input configured to receive the delayed data signal, and an output configured to output a second logic output value being one of a logic "1" signal or a logic "0" signal based on the values of the data signal and the delayed data signal; and
    a NFET inverter including an input configured to receive the second logic output value from the AND-gate and invert the second logic output value to generate an NFET selector signal.

4. The high-speed voltage clamping circuit of claim 3, wherein the PFET biasing circuit comprises:
    a PFET tri-state buffer including a first input configured to receive an analog PFET biasing voltage (VBP), a second input configured to receive the PFET selector signal output from the PFET inverter, and an output configured to selectively output the analog PFET biasing voltage (VBP); and
    a pull-up PFET including a source terminal configured to receive a first source voltage supply, a gate terminal configured to receive the PFET selector signal, and a drain terminal connected to the output of the PFET tri-state buffer; and the NFET biasing circuit comprises:
- a NFET tri-state buffer including a first input configured to receive an analog NFET biasing voltage (VBN) a second input configured to receive the NFET selector signal output from the NFET inverter, and an output configured to selectively output the analog NFET biasing voltage (VBN);
- a pull-down NFET including a source terminal configured to receive a second source voltage supply, a gate terminal configured to receive the NFET selector signal, and a drain terminal connected to the output of the NFET tri-state buffer.

5. The high-speed voltage clamping circuit of claim 2, wherein the load includes a receiver including an input in signal communication with the FET clamp circuit to receive the input data signal, and an output in signal communication with each of the PFET timing circuit and the NFET timing circuit to deliver the data signal thereto.

6. A method of controlling a high-speed voltage clamping circuit, the method comprising:
- generating, from a p-type field effect transistor (PFET) biasing circuit, a PFET biasing voltage;
- generating, from an n-type field effect transistor (NFET) biasing circuit, an NFET biasing voltage; and
- controlling operation of a clamping circuit using the PFET biasing voltage in response to a voltage overshoot event and controlling operation of the clamping circuit using the NFET biasing voltage in response to a voltage undershoot event, wherein controlling the operation of the clamping circuit further comprises:
- controlling a first time duration at which the PFET biasing circuit operates using a PFET timing circuit that is in signal communication with the PFET biasing circuit; and
- controlling a second time duration at which the NFET biasing circuit operates using an NFET timing circuit that is in signal communication with the NFET biasing circuit,
- wherein the first time duration is a time duration during which the PFET biasing circuit outputs the PFET biasing voltage to the clamping circuit, and wherein the second time duration is a time duration during which the NFET biasing circuit outputs the NFET biasing voltage to the clamp circuit, and
- wherein controlling the first and second time durations further comprises:
- controlling, by the PFET timing circuit, the first time duration in response to a data signal transitioning from a logic 0 value to a logic 1 value and to a delayed data signal transitioning from a logic value 0 to a logic value 1; and
- controlling, by the NFET timing circuit, the second time duration in response to the data signal transitioning from a logic 1 value to a logic 0 value and the delayed data signal transitioning from a logic value 1 to a logic value 0.

7. The method of claim 6, wherein the PFET biasing voltage controls a clamping PFET included in the FET clamp circuit to protect against the voltage overshoot event occurring in response to transmitting an input data signal to a load, and wherein the NFET biasing voltage controls a clamping NFET including in the FET clamp circuit to protect against the voltage undershoot event occurring in response to transmitting the input data signal to the load.

8. The method of claim 6, wherein controlling the operation of the PFET biasing circuit further comprises:
- delivering that data signal to a first input of an OR-gate;
- delivering the delayed data signal to a second input of the OR-gate;
- outputting a first logic output value being one of a logic "1" signal or a logic "0" signal based on the values of the data signal and the delayed data signal;
- delivering the first logic output value to an input of a PFET inverter and inverting the first logic output value to generate a PFET selector signal that controls the PFET biasing circuit.

9. The method of claim 8, wherein controlling operation of the NFET biasing circuit further comprises:
- delivering the data signal to a first input of an AND-gate;
- delivering the delayed data signal to a second input of the AND-gate;
- outputting a second logic output value being one of a logic "1" signal or a logic "0" signal based on the values of the data signal and the delayed data signal;
- delivering the second logic output value to an input of an NFET inverter and inverting the second logic output value to generate an NFET selector signal that controls the NFET biasing circuit.

10. The method of claim 7, wherein the load includes a receiver including an input in signal communication with the FET clamp circuit to receive the input data signal, and an output in signal communication with each of the PFET timing circuit and the NFET timing circuit to deliver the data signal thereto.

* * * * *